(12) United States Patent
Song et al.

(10) Patent No.: US 10,973,124 B2
(45) Date of Patent: Apr. 6, 2021

(54) CONNECTOR ASSEMBLY HAVING AN ADAPTER TO CONNECT TWO CIRCUIT BOARDS

(71) Applicant: Tyco Electronics (Shanghai) Co. Ltd., Shanghai (CN)

(72) Inventors: Zhigang Song, Shanghai (CN); Lin Ni, Shanghai (CN); Jlahui Chen, Shanghai (CN); Yunhe Wang, Shanghai (CN); Songhua Liu, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/802,847

(22) Filed: Nov. 3, 2017

(65) Prior Publication Data

US 2018/0124921 A1    May 3, 2018

(30) Foreign Application Priority Data

Nov. 3, 2016 (CN) .......................... 2016 1 0971286

(51) Int. Cl.
| | |
|---|---|
| *H05K 1/14* | (2006.01) |
| *H01R 13/20* | (2006.01) |
| *H01R 13/11* | (2006.01) |
| *H01R 12/52* | (2011.01) |
| *H01R 12/73* | (2011.01) |
| *H01R 13/502* | (2006.01) |

(Continued)

(52) U.S. Cl.
CPC ............. *H05K 1/148* (2013.01); *H01R 12/52* (2013.01); *H01R 12/73* (2013.01); *H01R 13/11* (2013.01); *H01R 13/20* (2013.01); *H01R 13/502* (2013.01); *H01R 13/6277* (2013.01); *H01R 13/6658* (2013.01); *H01R 24/564* (2013.01); *H01R 9/05* (2013.01); *H01R 12/62* (2013.01); *H01R 13/514* (2013.01); *H01R 13/639* (2013.01); *H01R 24/38* (2013.01); *H01R 24/50* (2013.01); *H01R 24/54* (2013.01); *H01R 24/542* (2013.01); *H01R 31/06* (2013.01); *H01R 33/88* (2013.01); *H01R 33/94* (2013.01); *H01R 2103/00* (2013.01)

(58) Field of Classification Search
CPC ......... H01R 9/05; H01R 24/38; H01R 24/54; H01R 31/06; H01R 33/88; H01R 33/94; H01R 13/6277; H01R 13/20; H01R 13/11; H01R 12/52; H01R 12/73; H01R 13/502; H01R 13/6658; H01R 24/564; H01R 24/542; H01R 24/50; H01R 12/62; H01R 2103/00; H01R 13/514; H01R 13/639; H05K 1/148
USPC ................................. 439/578, 638, 654, 349
See application file for complete search history.

(56) References Cited

U.S. PATENT DOCUMENTS 4,925,403 A * 5/1990 Zorzy ................ H01R 13/6315
                                                              439/578
5,074,809 A * 12/1991 Rousseau ............... H01R 24/44
                                                              439/578

(Continued)

*Primary Examiner* — Abdullah A Riyami
*Assistant Examiner* — Justin M Kratt
(74) *Attorney, Agent, or Firm* — Barley Snyder

(57) ABSTRACT

An adapter for mating with a receptacle comprises a cylindrical outer conductor, a columnar center conductor disposed in the outer conductor, and an insulator disposed between the outer conductor and the center conductor. The outer conductor has a recess in an inner wall at a first end of the outer conductor. The insulator electrically isolates the outer conductor from the center conductor.

21 Claims, 9 Drawing Sheets

(51) Int. Cl.
  *H01R 13/627* (2006.01)
  *H01R 13/66* (2006.01)
  *H01R 24/56* (2011.01)
  *H01R 24/54* (2011.01)
  *H01R 24/50* (2011.01)
  *H01R 33/94* (2006.01)
  *H01R 13/514* (2006.01)
  *H01R 24/38* (2011.01)
  *H01R 13/639* (2006.01)
  *H01R 9/05* (2006.01)
  *H01R 31/06* (2006.01)
  *H01R 33/88* (2006.01)
  *H01R 12/62* (2011.01)
  *H01R 103/00* (2006.01)

(56) References Cited

U.S. PATENT DOCUMENTS

| | | | | |
|---|---|---|---|---|
| 6,227,868 | B1* | 5/2001 | Wlodarski | H01R 24/40 |
| | | | | 439/63 |
| 6,663,397 | B1* | 12/2003 | Lin | H01R 13/6277 |
| | | | | 439/154 |
| 7,500,873 | B1* | 3/2009 | Hart | H01R 4/023 |
| | | | | 439/350 |
| 2007/0275584 | A1* | 11/2007 | Keating | H01R 13/5219 |
| | | | | 439/271 |
| 2011/0237123 | A1* | 9/2011 | Burris | H01R 13/6277 |
| | | | | 439/578 |

\* cited by examiner

CONNECTOR ASSEMBLY HAVING AN ADAPTER TO CONNECT TWO CIRCUIT BOARDS

CROSS-REFERENCE TO RELATED APPLICATION

This application claims the benefit of the filing date under 35 U.S.C. § 119(a)-(d) of Chinese Patent Application No. 201610971286.7, filed on Nov. 3, 2016.

FIELD OF THE INVENTION

The present invention relates to an electrical connector assembly and, more particularly, to a connector assembly having an adapter to connect two circuit boards.

BACKGROUND

In the prior art, an electrical connector assembly for connecting a PCB (Print Circuit Board) to another PCB typically comprises two receptacles and one adapter. Each receptacle generally comprises a cylindrical outer terminal, a column center terminal, an insulation body, and an insulation housing. The center terminal is disposed in the outer terminal and the insulation body is disposed between the center terminal and the outer terminal to support the center terminal and electrically isolate the center terminal from the outer terminal. The outer terminal is accommodated and positioned in the insulation housing.

The adapter generally comprises a cylindrical outer conductor, a column center conductor, and an insulator. The center conductor is disposed in the outer conductor and the insulator is disposed between the center conductor and the outer conductor to support the center conductor and electrically isolate the center conductor from the outer conductor. Both ends of the adapter are adapted to be mated with the two receptacles, respectively. In the prior art, a first end of the adapter is locked and engaged with a first receptacle and an opposite second end of the adapter is slidably engaged with the second receptacle.

In order to lock and engage the first end of the adapter with the first receptacle, two technical solutions are typically proposed in the prior art. In a first solution, the cylindrical outer conductor of the adapter is assembled with the outer terminal of the first receptacle in an interference-fit. However, in the first solution, a contact area between the cylindrical outer conductor of the adapter and the outer terminal of the receptacle is too large, even if there is a multi-point contact in an axial direction of the connector assembly, which reduces the mutual adjustment performance. In a second solution, the insulation body of the adapter is assembled with the insulator of the first receptacle in an interference-fit. However, in the second solution, engagement strength between the insulator and the insulation body does not provide sufficient mechanical retention, which causes the one end of the adapter to be easily separated from the receptacle.

SUMMARY

An adapter according to the invention for mating with a receptacle comprises a cylindrical outer conductor, a columnar center conductor disposed in the outer conductor, and an insulator disposed between the outer conductor and the center conductor. The outer conductor has a recess in an inner wall at a first end of the outer conductor. The insulator electrically isolates the outer conductor from the center conductor.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
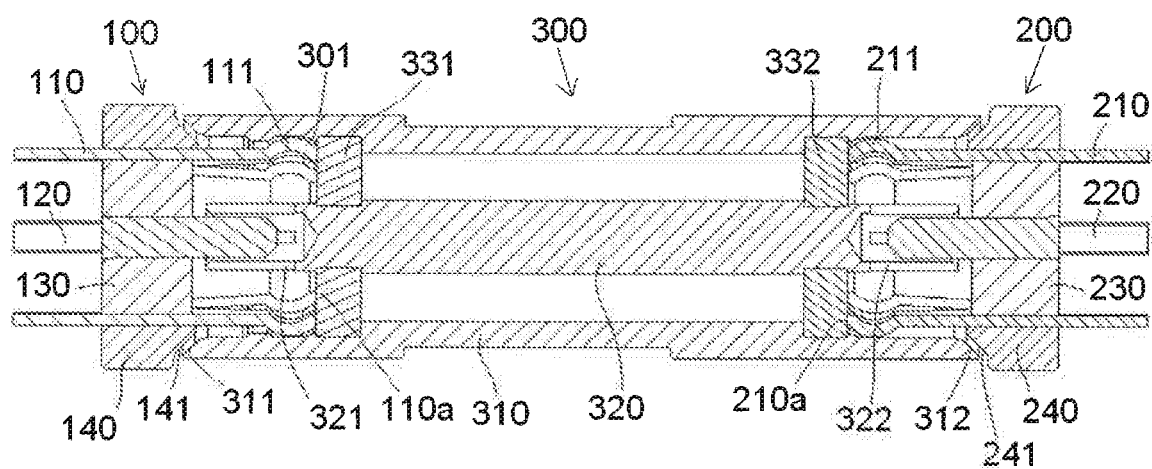
FIG. 1 is a longitudinal sectional view of a connector assembly according to an embodiment of the invention.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

A connector assembly according to the invention is shown in FIGS. 1-5. The connector assembly comprises an adapter 300, a first receptacle 100 attached to a first end of the adapter 300, and a second receptacle 200 attached to an opposite second end of the adapter 300.

Figure 2:
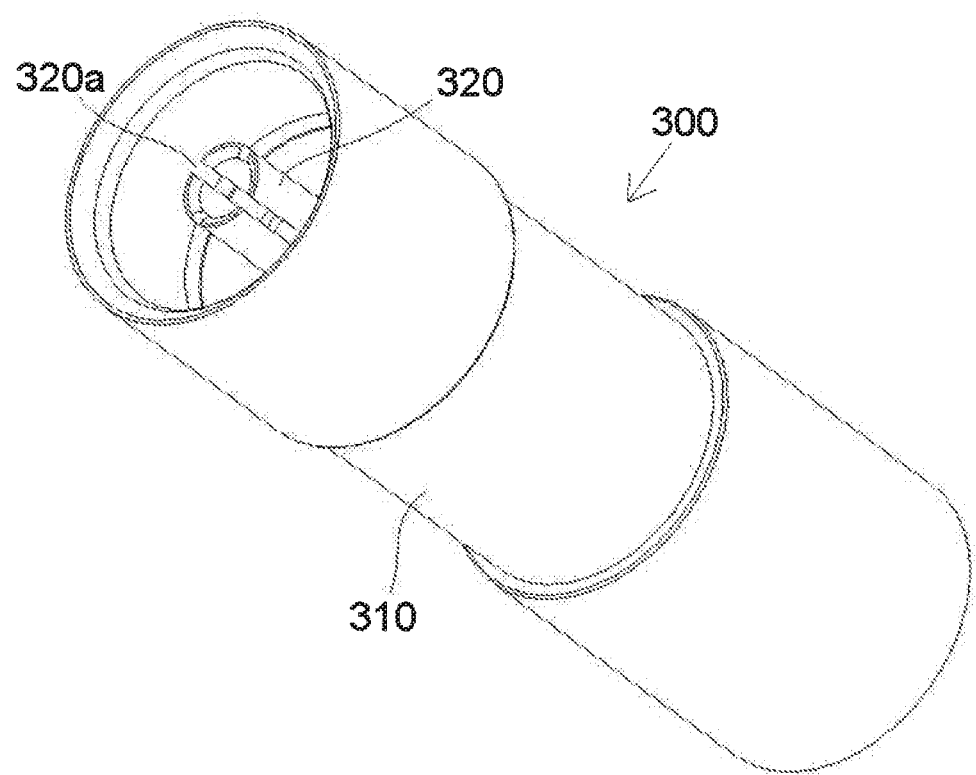
FIG. 2 is a perspective view of an adapter of the connector assembly of FIG. 1.

The adapter 300 is shown in FIGS. 1 and 2 and comprises a cylindrical outer conductor 310, a columnar center conductor 320 disposed in the outer conductor 310, and an insulator 331, 332 disposed between the outer conductor 310 and the center conductor 320 to electrically isolate the outer conductor 310 from the center conductor 320.

Figure 5:
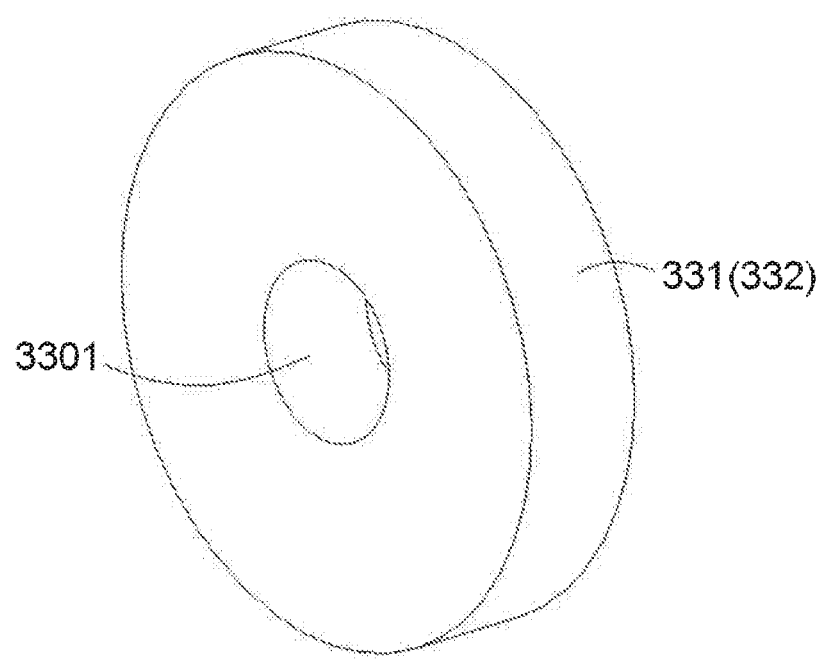
FIG. 5 is a perspective view of a first insulator or a second insulator of the adapter of FIG. 2.

The insulator 331, 332 of the adapter 300, as shown in FIG. 1, comprises a first insulator 331 mounted on a first end 321 of the center conductor 320 and a second insulator 332 mounted on an opposite second end 322 of the center conductor 320. Both ends 321, 322 of the center conductor 320 are supported and held on the insulator 331, 332; the first end 321 of the center conductor 320 is held on the first insulator 331 and the second end 322 of the center conductor 320 is held on the second insulator 322. The first insulator 331 and second insulator 332 are identical, as shown in FIG. 5. The first insulator 331 and the second insulator 332 each have a columnar shape and an axial positioning passageway 3301 extending through the insulator 331, 332. Both ends 321, 322 of the center conductor 320 are fit into the axial positioning passageways 3301 of the first insulator 331 and the second insulator 332, respectively.

Figure 3:
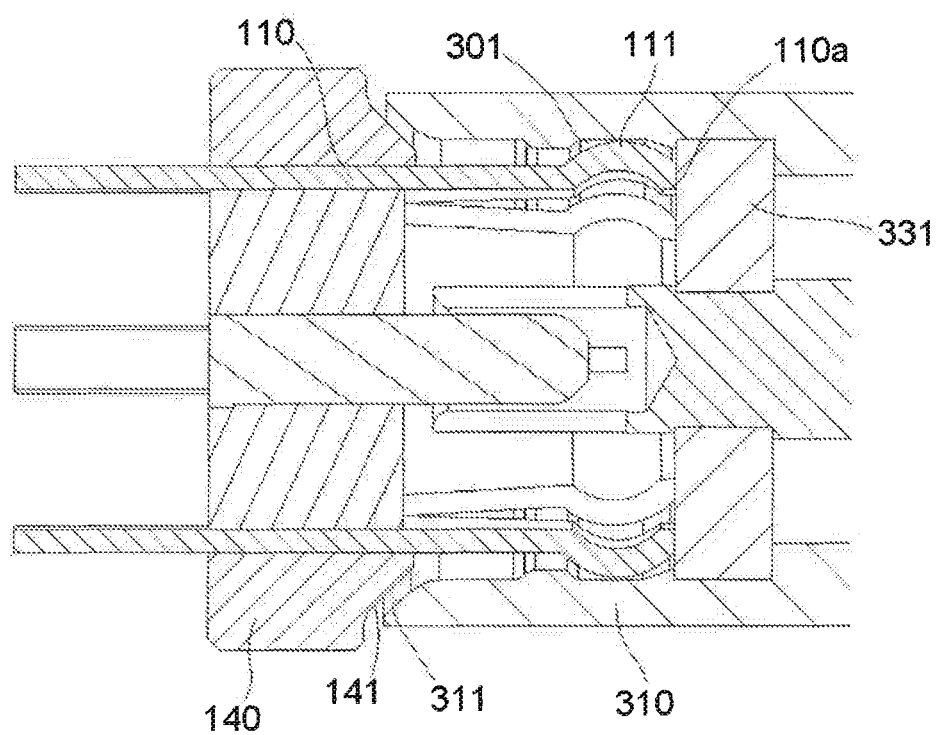
FIG. 3 is an enlarged longitudinal sectional view of the connector assembly of FIG. 1.
Figure 4:
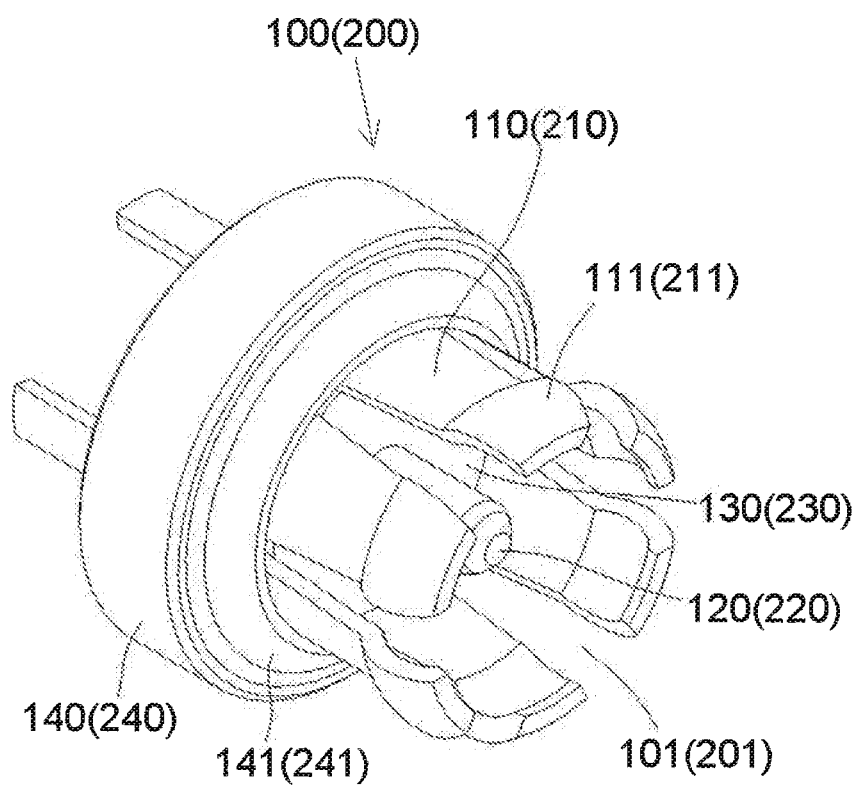
FIG. 4 is a perspective view of a first receptacle or a second receptacle of the connector assembly of FIG. 1.

The first receptacle 100, as shown in FIG. 4, comprises a cylindrical first outer terminal 110, a columnar first center terminal 120 disposed in the first outer terminal 110, and a first insulation body 130 disposed between the first outer terminal 110 and the first center terminal 120 to electrically isolate the first outer terminal 110 from the first center terminal 120. The first outer terminal 110 has a first annular protrusion 111 on an outer wall of one end thereof. The first outer terminal 110 has at least one first axial slit 101 in a first end thereof. The at least one first axial slit 101 divides the first end of the first outer terminal 110 into a plurality of petals so that the first end of the first outer terminal 110 is formed as a resilient finger with a plurality of petal structures. A free end of each petal is formed as an arc protrusion protruding outwardly, and a plurality of arc protrusions of the plurality of petals form the first annular protrusion 111. The first receptacle 100, as shown in FIGS. 3 and 4, further comprises a first insulation housing 140 in which the first outer terminal 110, the first center terminal 120 and the first insulation body 130 are held.

As shown in FIGS. 1 and 3, the first receptacle 100 is adapted to be locked onto a first end of the adapter 300. The outer conductor 310 of the adapter 300 has a recess 301 in an inner wall at the first end. The first annular protrusion 111 on the outer terminal 110 of the first receptacle 100 is adapted to be elastically snap-fit into the recess 301 to lock the first receptacle 100 onto the first end of the adapter 300. The first annular protrusion 111 is brought into electrical contact with the inner wall of the outer conductor 310 of the adapter 300. The first end of the first outer terminal 110 has an end surface 110a abutting against the insulators 331, 332 to prevent the end surface 110a from electrically contacting the inner wall of the outer conductor 310. The outer conductor 310 of the adapter 300 and the first outer terminal 110 of the first receptacle 100 are in electrical contact with each other only through the first annular protrusion 111.

The first insulation housing 140, as shown in FIGS. 1 and 3, is disposed at the first end of the outer conductor 310 and spaced apart therefrom by a predetermined gap. The gap allows the outer conductor 310 to deflect with respect to an axial direction of the connector assembly by a predetermined angle. In various embodiments, the predetermined angle is greater than 0 degrees and less than 15 degrees, greater than 0 degrees and less than 10 degrees, or greater than 0 degrees and less than 5 degrees. The outer conductor 310 has a conical inner end surface 311 tapered inwardly at the first end thereof and the first insulation housing 140 has a conical outer end surface 141 tapered toward the outer conductor 310. The conical inner end surface 311 faces the conical outer end surface 141 and is spaced apart therefrom by the predetermined gap.

When the outer conductor 310 is deflected with respect to the axial direction of the connector assembly by a permissible maximum deflection angle, the conical inner end surface 311 of the outer conductor 310 abuts the conical outer end surface 141 of the first insulation housing 140 to prevent the first end of the outer conductor 310 from being in electrical contact with the first outer terminal 110. As described above, this ensures that the outer conductor 310 and the first outer terminal 110 are brought into electrical contact with each other only through the first annular protrusion 111.

As shown in FIGS. 1 and 2, the first end of the first center terminal 120 is inserted into the first end 321 of the center conductor 320 and into electrical contact therewith by sliding. The center conductor 320, as shown in FIG. 2, has at least one axial slit 320a in the first end 321. The at least one axial slit 320a divides the first end 321 of the center conductor 320 into a plurality of petals so that the first end 321 is a resilient finger with the plurality of petal structures.

The second receptacle 200, as shown in FIGS. 1 and 4, is identical to the first receptacle 100. The second receptacle 200 comprises a cylindrical second outer terminal 210, a columnar second center terminal 220 disposed in the second outer terminal 210, and a second insulation body 230 disposed between the second outer terminal 210 and the second center terminal 220 to electrically isolate the second outer terminal 210 from the second center terminal 220. The second outer terminal 210 has a second annular protrusion 211 on an outer wall of a first end thereof. The second outer terminal 210 has at least one second axial slit 201 in the first end. The at least one second axial slit 201 divides the first end of the second outer terminal 210 into a plurality of petals so that the first end of the second outer terminal 210 is formed as a resilient finger with a plurality of petal structures. A free end of each petal is formed as an arc protrusion protruding outwardly, and a plurality of arc protrusions of the plurality of petals form the second annular protrusion 211. The second receptacle 200 further comprises a second insulation housing 240 in which the second outer terminal 210, the second center terminal 220 and the second insulation body 230 are held.

The second annular protrusion 211 is brought into electrical contact with the inner wall of the outer conductor 310 of the adapter 300 through sliding, as shown in FIG. 1. The first end of the second outer terminal 210 has an end surface 210a abutted against the insulator 322 of the adapter 300 to prevent the end surface 210a of the first end of the second outer terminal 210 from being in electrical contact with the inner wall of the outer conductor 310. The outer conductor 310 of the adapter 300 and the second outer terminal 210 of the second receptacle 200 are in electrical contact with each other only through the second annular protrusion 211.

The second insulation housing 240, as shown in FIGS. 1 and 4, is disposed at the second end of the outer conductor 310 and is spaced apart therefrom by a predetermined gap to allow the outer conductor 310 to be deflectable with respect to the axial direction of the connector assembly by a predetermined angle. In various embodiments, the predetermined angle is greater than 0 degrees and less than 15 degrees, greater than 0 degrees and less than 10 degrees, or greater than 0 degrees and less than 5 degrees. The outer conductor 310 has a conical inner end surface 312 tapered inwardly at the second end and the second insulation housing 240 has a conical outer end surface 241 tapered toward the outer conductor 310. The conical inner end surface 312 faces the conical outer end surface 241 and is spaced apart therefrom by the predetermined gap.

When the outer conductor 310 is deflected with respect to the axial direction of the connector assembly by a permissible maximum deflection angle, the conical inner end surface 312 of the outer conductor 310 abuts the conical outer end surface 241 of the second insulation housing 240 to prevent the second end of the outer conductor 310 from being in electrical contact with the second outer terminal 210. As described above, this ensures that the outer conductor 310 of the adapter 300 and the second outer terminal 210 of the second receptacle 200 are brought into electrical contact with each other only through the second annular protrusion 211.

As shown in FIGS. 1 and 2, the second end 321 of the center conductor 320 has a cylindrical shape and the first end of the second center terminal 220 is inserted into the second end 322 of the center conductor 320 and into electrical contact therewith through sliding. The center conductor 320 has at least one axial slit 320a in the second end 322. The at least one axial slit 320a divides the second end 322 of the center conductor 320 into a plurality of petals so that the second end 322 of the center conductor 320 is a resilient finger with the plurality of petal structures.

The first outer terminal 110 and the second outer terminal 210 shown in FIG. 4 are each formed by a stamping process. The first insulation body 130, the second insulation body 230, the first insulation housing 140, and the second insulation housing 240 are each formed by an injection molding process.

In an embodiment, the connector assembly is a radio frequency (RF) coaxial connector assembly. The RF coaxial connector is adapted to connect two circuit boards so that a RF signal may be transmitted from one circuit board to the other circuit board via the RF coaxial connector assembly.

A connector assembly according to another embodiment of the invention is shown in FIGS. 6-9. Like reference numbers indicate like elements and only the differences with respect to the embodiment of the connector assembly shown in FIGS. 1-5 will be described in detail herein.

Figure 6:
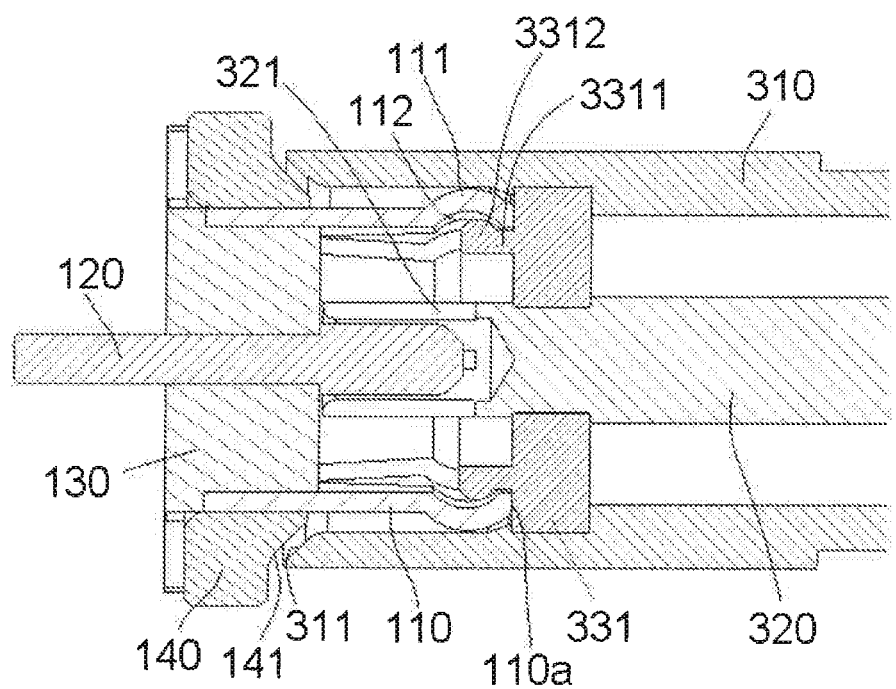
FIG. 6 is an enlarged longitudinal sectional view of a connector assembly according to another embodiment of the invention.
Figure 7:
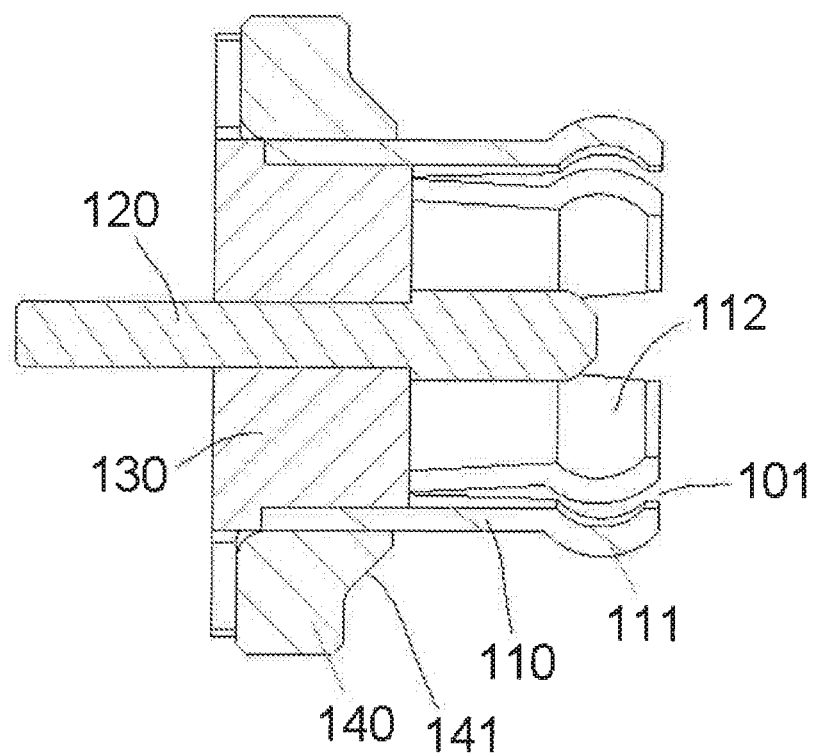
FIG. 7 is a sectional view of a first receptacle of the connector assembly of FIG. 6.
Figure 8:
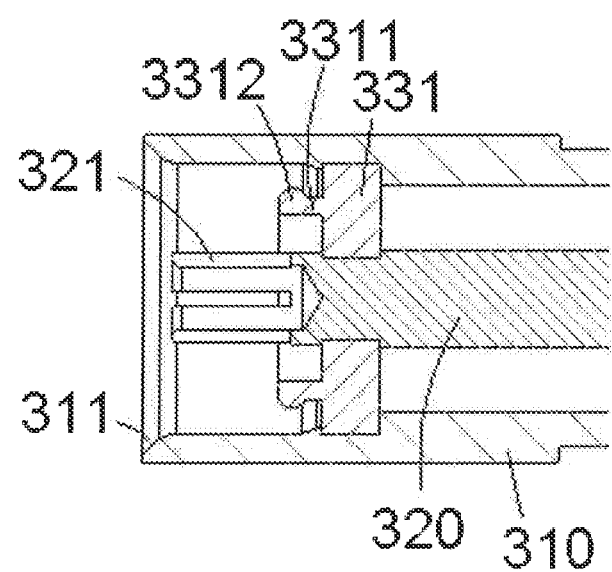
FIG. 8 is a sectional view of an end of an adapter of the connector assembly of FIG. 6.
Figure 9:
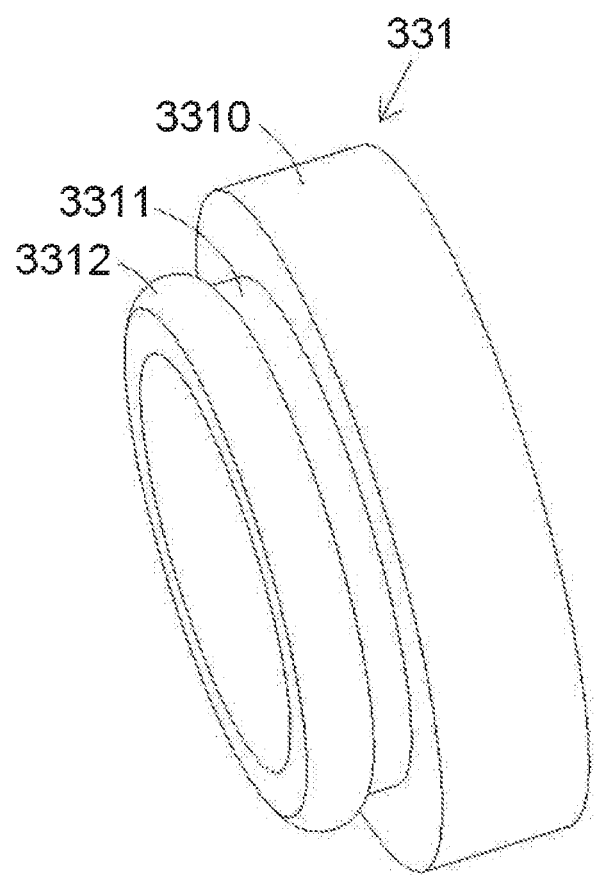
FIG. 9 is a perspective view of an insulator of the adapter of FIG. 8.

The insulator 331 of the adapter 300, as shown in FIGS. 8 and 9, comprises a columnar main body 3310, a cylindrical extending portion 3311 extending from the columnar main body 3310, and an annular protrusion 3312 formed on a free end of the cylindrical extending portion 3311. The first outer terminal 110 has an annular recess 112, as shown in FIGS. 6 and 7, protruding outwardly in an inner wall of the first end. The annular protrusion 3312 is adapted to be elastically snap-fit into the annular recess 112 to lock the first receptacle 100 onto the first end of the adapter 300. In an embodiment, the insulator 331 is formed of a plastic material. The first annular protrusion 111 on the first end of the first outer terminal 110, as shown in FIGS. 6 and 7, is opposite to the annular recess 112 in a radial direction of the first outer terminal 110. The annular protrusion 111 and the annular recess 112 may be formed at the same position of the first end of the first outer conductor 100 through stamping.

What is claimed is:

1. A connector assembly, comprising:
   an adapter including:
   (a) a cylindrical outer conductor having an inner wall;
   (b) a columnar center conductor disposed in the outer conductor; and
   (c) an insulator disposed between the outer conductor and the center conductor to electrically isolate the outer conductor from the center conductor, the insulator having a cylindrical extending portion and an annular protrusion disposed on the cylindrical extending portion; and
   a first receptacle adapted to be assembled onto a first end of the adapter and locked onto the first end of the adapter including:
   (a) a cylindrical first outer terminal having a first annular protrusion on an outer wall of a first end thereof and an annular recess in an inner wall of the first end of the first outer terminal, the annular protrusion of the insulator elastically snap-fitting into the annular recess of the first outer terminal portion, and the first outer terminal and the outer conductor only in electrical contact through the first annular protrusion electrically contacting the inner wall of the outer conductor;
   (b) a columnar first center terminal disposed in the first outer terminal; and
   (c) a first insulation body disposed between the first outer terminal and the first center terminal to electrically isolate the first outer terminal from the first center terminal.

2. The connector assembly of claim 1, wherein the outer conductor of the adapter has a recess in the inner wall at the first end of the adapter, the first annular protrusion is elastically snap-fitted into the recess.

3. The connector assembly of claim 1, wherein the first annular protrusion of the first outer terminal is opposite the annular recess of the first outer terminal in a radial direction of the first outer terminal and the first annular protrusion and the annular recess are simultaneously formed through stamping.

4. The connector assembly of claim 1, wherein the first outer terminal includes a plurality of axial slits dividing the first end of the first outer terminal and forming a resilient finger with a plurality of petal structures.

5. The connector assembly of claim 1, wherein the first end of the first outer terminal has an end surface abutting the insulator, the insulator preventing the end surface of the first outer terminal from electrically contacting the inner wall of the outer conductor.

6. The connector assembly of claim 1, wherein the first receptacle has a first insulation housing in which the first outer terminal, the first center terminal, and the first insulation body are held.

7. The connector assembly of claim 6, wherein the first insulation housing is disposed at a first end of the outer conductor and is spaced apart from the first end of the outer conductor by a predetermined gap, the predetermined gap permitting the outer conductor to deflect with respect to an axial direction of the connector assembly by a predetermined angle.

8. The connector assembly of claim 7, wherein the predetermined angle is greater than 0 degrees and less than 15 degrees.

9. The connector assembly of claim 7, wherein the outer conductor has a conical inner end surface tapered inwardly at the first end of the outer conductor, the first insulation housing has a conical outer end surface tapered toward the outer conductor, and the conical inner end surface faces the conical outer end surface and is spaced apart therefrom by the predetermined gap.

10. The connector assembly of claim 9, wherein when the outer conductor is deflected with respect to the axial direction of the connector assembly by a permissible maximum deflection angle, the conical inner end surface of the outer conductor abuts the conical outer end surface of the first insulation housing and prevents the first end of the outer conductor from electrically contacting the first outer terminal.

11. The connector assembly of claim 1, wherein a first end of the center conductor has a cylindrical shape and a first end of the first center terminal is inserted into the first end of the center conductor by sliding.

12. The connector assembly of claim 11, wherein the center conductor includes a plurality of axial slits dividing the first end of the center conductor and forming as a resilient finger with a plurality of petal structures.

13. The connector assembly of claim 1, further comprising a second receptacle adapted to be assembled onto a second end of the adapter opposite the first end of the adapter in a sliding fit manner.

14. The connector assembly of claim 13, wherein the second receptacle includes:

(a) a cylindrical second outer terminal having a second annular protrusion on an outer wall of a first end thereof, the second outer terminal and the outer conductor only in electrical contact through the second annular protrusion electrically contacting the inner wall of the outer conductor;

(b) a columnar second center terminal disposed in the second outer terminal; and (c) a second insulation body disposed between the second outer terminal and the second center terminal to electrically isolate the second outer terminal from the second center terminal.

15. The connector assembly of claim 14, wherein the first receptacle is identical to the second receptacle.

16. The connector assembly of claim 1, wherein the connector assembly is a radio frequency coaxial connector assembly.

17. An adapter for mating with a receptacle having an annular protrusion, comprising:

a cylindrical outer conductor having a recess in an inner wall at a first end of the outer conductor to receive the annular protrusion formed from a plurality of petals having a free end arc protrusion, and thereby forming the only electrical contact between the cylindrical outer conductor and said receptacle;

a columnar center conductor disposed in the outer conductor;

a first insulator supporting a first end of the cylindrical outer conductor and disposed between the cylindrical outer conductor and the columnar center conductor to electrically isolate the cylindrical outer conductor from the columnar center conductor, the first insulator defining an annular protrusion for engaging with an inner surface of the plurality of petals;

a second insulator supporting a second end of the cylindrical outer conductor and disposed between the cylindrical outer conductor and the columnar center conductor to electrically isolate the cylindrical outer conductor from the columnar center conductor, the second insulator spaced apart from first insulator.

18. A receptacle for mating with an adapter, comprising:

a cylindrical outer terminal having an annular protrusion formed from a plurality of petals having a free end arc protrusion on an outer wall of a first end thereof and an annular recess on an inner wall of the first end thereof opposite the arc protrusion, the annular protrusion elastically snap-fitting into a recess formed in an inner wall of an outer conductor of the adapter, and thereby forming the only electrical contact between the cylindrical outer terminal and the outer conductor of the adapter;

a columnar center terminal disposed in the outer terminal; and an insulation body receiving, and electrically isolating the outer terminal and the center terminal.

19. An adapter for mating with a receptacle, comprising:

a cylindrical outer conductor;

a columnar center conductor disposed in the outer conductor; and an insulator disposed between the outer conductor and the center conductor to electrically isolate the outer conductor from the center conductor, the insulator having a cylindrical extending portion and an annular protrusion formed on the cylindrical extending portion, an outer terminal having an annular recess in an inner wall of a first end of the outer terminal, the annular protrusion of the insulator elastically snap-fitting into the annular recess of the outer terminal.

20. A receptacle for mating with an adapter, comprising:

a cylindrical outer terminal having an annular protrusion on an outer wall of a first end thereof and an annular recess in an inner wall of the first end, the annular protrusion electrically contacting an inner wall of an outer conductor of the adapter, the annular recess engaging an annular protrusion formed on an insulator of the adapter;

a columnar center terminal disposed in the outer terminal; and an insulation body disposed between the outer terminal and the center terminal to electrically isolate the outer terminal from the center terminal.

21. An adapter for mating with a receptacle, comprising:

a cylindrical outer conductor;

a columnar center conductor disposed in the outer conductor; and an insulator disposed between the outer conductor and the center conductor and electrically isolating the outer conductor from the center conductor, the insulator having a columnar main body receiving and radially extending outward from the columnar center conductor, a cylindrical extending portion extending from the columnar main body, and an annular protrusion on a free end of the cylindrical extending portion.

\* \* \* \* \*